United States Patent [19]

Taneya et al.

[11] Patent Number: 4,730,326

[45] Date of Patent: Mar. 8, 1988

[54] SEMICONDUCTOR LASER ARRAY DEVICE

[75] Inventors: Mototaka Taneya; Sadayoshi Matsui; Mitsuhiro Matsumoto, all of Tenri; Saburo Yamamoto, Nara; Seiki Yano, Kashihara, all of Japan

[73] Assignee: Sharp Kabushiki Kaisha, Osaka, Japan

[21] Appl. No.: 773,966

[22] Filed: Sep. 9, 1985

[30] Foreign Application Priority Data

Sep. 12, 1984 [JP] Japan ................................ 59-191189
Sep. 12, 1984 [JP] Japan ................................ 59-191191

[51] Int. Cl.$^4$ ............................................. H01S 3/19
[52] U.S. Cl. ........................................ 372/44; 372/50
[58] Field of Search ..................... 372/44, 46, 48, 50, 372/45

[56] References Cited

U.S. PATENT DOCUMENTS 4,603,421 7/1986 Scifres et al. .......................... 372/46

Primary Examiner—Gene Wan
Attorney, Agent, or Firm—Armstrong, Nikaido, Marmelstein & Kubovcik

[57] ABSTRACT

A semiconductor laser array device comprising a plurality of index-guided lasing filaments formed in an active layer in a parallel manner, and an electrical current injection portion formed on the upper face of grown layers therefor the flat shape of the electrical current injection portion is asymmetrical with respect to any line which is parallel to the lasing filaments.

7 Claims, 14 Drawing Figures

SEMICONDUCTOR LASER ARRAY DEVICE

BACKGROUND OF THE INVENTION

1. Field of the invention:

This invention relates to a semiconductor laser array device which can attain a far-field pattern having a single peak and/or which has a deflecting function.

2. Description of the prior art:

Semiconductor laser devices which are useful as light sources of laser discs, space communication systems, etc., must produce high-output power. However, conventional semiconductor laser devices having a single lasing filament structure can only produce a low 40 mW output power. Even the most advanced semiconductor laser devices would produce 60–70 mW at their best so long as a single filament structure is adopted thereto. Semiconductor laser array devices, in which a plurality of lasing filaments are disposed in a parallel manner to achieve an optical phase coupling between the adjacent filaments, have been proposed by, for example, W. Streifer et al., of Xerox Company, Appl. Phys. Lett. 42,645 (1983), which reports that output power of as high as 1.5 W can be obtained by a gain guided semiconductor laser array device having forty filaments. However, the optical phase shift between the adjacent filaments of this device is 180°, resulting in a far-field pattern having two peaks. Moreover, an index guided semiconductor laser array device proposed by D. Botez et al., of RCA Laboratories, Fourth International Conference on Integrated Optics and Optical Fiber Communication, Abstract 29B5-2, Jun. 27-30, 1983, Tokyo, Japan, has a structure of nine filaments which can produce an output power of 200 mW, but this device cannot attain a 0°-phase shift between the adjacent filaments at all, as well.

FIGS. 9(a) and 9(b) show a typical conventional index guided semiconductor laser array device, which can be produced as follows: On an n-GaAs substrate 1, an n-$Al_xGa_{1-x}$As cladding layer 2, an n-(or p-)$Al_yGa_{1-y}$As active layer 3, a p-$Al_xGa_{1-x}$As cladding layer 4 and p$^+$-GaAs cap layer 5 are successively grown by liquid phase epitaxy, molecular beam epitaxy, metal organic-chemical vapor deposition, vapor phase epitaxy or the like. Then, a plurality of channels having a width of 2 μm and a pitch of 5 μm, which reaches the inside of the p-cladding layer 4, are formed in a parallel manner by photolithography and an etching technique. On the resulting channeled substrate, an n-$Al_zGa_{1-z}$As buried layer 6 is grown by liquid phase epitaxy to fill the channels therewith (wherein $0 \leq z < y < x$ or $0 \leq y < x < z$). Then, an electrode 8 is formed on the whole back face of the substrate, and an electrode 7 is formed on the upper face of the grown layers in such a manner that it is symmetrical with respect to a line 100 which is parallel to the waveguides (i.e., channels). Finally, faces which are at right angles to the waveguides are formed by a cleavage, resulting in the facets for laser resonation. The resulting device contains the active layer 3 composed of portions 9 having a high equivalent index and the other portions 10 having a low equivalent index. The high effective refractive portions 10 constitute lasing filaments because each of them is constricted by the low effective refractive portions 9.

FIG. 10 shows a typical far-field pattern of the above-mentioned device shown in FIGS. 9(a) and 9(b), exhibiting two peaks with the same optical intensity. The resulting laser which emits light in two different directions cannot be concentrated into a spot fashion by means of any optical lens. Thus, a device attaining such a far-field pattern with two peaks cannot be put into practical use.

The reason why lasers emitting light in two different directions are produced in the conventional semiconductor laser array device can be explained as follows:

FIG. 11 shows an illustration of a laser oscillation process by the device shown in FIGS. 9(a) and 9(b), wherein the waveguides can be taken for lateral gratings 105 because periodic differences Δn in the refractive index have arisen between the high effective refractive portions 9 and the low effective refractive portions 10 in the active layer 3. The gratings 105 laterally exist with a period of Λ. The upper and lower faces of the device have been cleaved to form facets. In the index guided laser array device (i.e., lateral distributed-feedback device), the relationship between the period Λ of the gratings 105 and the oscillation wavelength λ within the device can be represented by the equation (1):

$$\pm \lambda/2\Lambda = \sin\theta \qquad (1)$$

wherein $\theta$ is the angle of the proceeding direction of lightwave to the direction of each of the waveguides.

The lightwave is propagated at the angle of $\theta$ to the direction of the gratings 105, resulting in two different waves 101 and 102 which proceed in the reverse direction as shown in FIG. 11. The two different lightwaves are radiated from the cleaved facet to produce two different lightwaves 103 and 104, both of which are at angles of $\alpha$ to the direction at right angles with the cleaved facet. The angle $\alpha$ is represented by the equation (2):

$$2\alpha = \pm 2\sin^{-1}\lambda_0/2\Lambda \qquad (2)$$

wherein $\lambda_0$ is the light wavelength in the air.

On the other hand, deflectable semiconductor laser array devices which can deflect light beams produced therefrom are required for the development of optical integrating circuits in such fields as in optical switches, optical information processing, etc.

Conventional deflecting means utilizing rotatable polygonal mirrors have disadvantages that they cannot be miniaturized and their deflection rate is extremely low, although their deflecting angles are great. Other conventional deflecting means utilizing holograms are disadvantageous in that their optical systems are so complicated that they cannot be miniaturized. Other conventional deflecting means containing dielectric substances utilizing specific electrooptic and/or acoustooptic effects are disadvantageous in that their deflecting angles are extremely small and the driving voltage must be maintained at a high level. Moreover, since the above-mentioned conventional deflecting means have no light-emitting function, they must be optically and precisely coupled to gas lasers or semiconductor lasers serving as light sources for practical use. Such optical and precise coupling of the deflecting means to the light sources is too troublesome for practical use.

SUMMARY OF THE INVENTION

The semiconductor laser array device of this invention which overcomes the above-discussed and numerous other disadvantages and deficiencies of the prior art, comprises a plurality of index-guided lasing filaments formed in an active layer in a parallel manner, and an electrical current injection portion formed on the upper face of grown layers, the flat shape of the electrical current injection portion being asymmetrical with respect to any line which is parallel to the lasing filaments.

The electrical current injection portion is, in a preferred embodiment, composed of the body, the flat shape of which is symmetrical with respect to a line along the lasing filaments, and additional edge portions which are positioned at both sides of the body, resulting in an asymmetrically flat shape as a whole with respect to any line along the lasing filaments.

The additional edge portions are, in a preferred embodiment, electrically connected to the body. Alternatively, the additional edge portions are, in a preferred embodiment, electrically separated from the body.

The additional edge portions are, in a preferred embodiment, composed of a pair of edge portions positioned at both sides of the body, respectively, in an asymmetrical manner with respect to any line along the lasing filaments.

The additional edge portions are, in a preferred embodiment, composed of two pairs of edge portions each pair of which are positioned at either side of the body, respectively, in an asymmetrical manner with respect to any line along the lasing filaments, resulting in one set consisting of the body and one pair of edge portions and another set consisting of the body and the other pair of edge portions to be excited by the injection of electrical current thereinto.

The electrical current injection portion is, in a preferred embodiment, an electrode formed by photolithography and a lift-off or etching technique.

Thus, the invention described herein makes possible the objects of (1) providing a semiconductor laser array device which is designed in such a manner that one of the two different lightwaves propagated in the reverse direction within the device has a greater gain than the other, and can attain laser oscillation from the device to produce a laser light, while the other lightwave cannot attain laser oscillation, resulting in the far-field pattern having a single peak; (2) providing a semiconductor laser array device which has a deflecting function; and (3) providing a deflectable semiconductor laser array device having a simple and compact structure.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 9A:
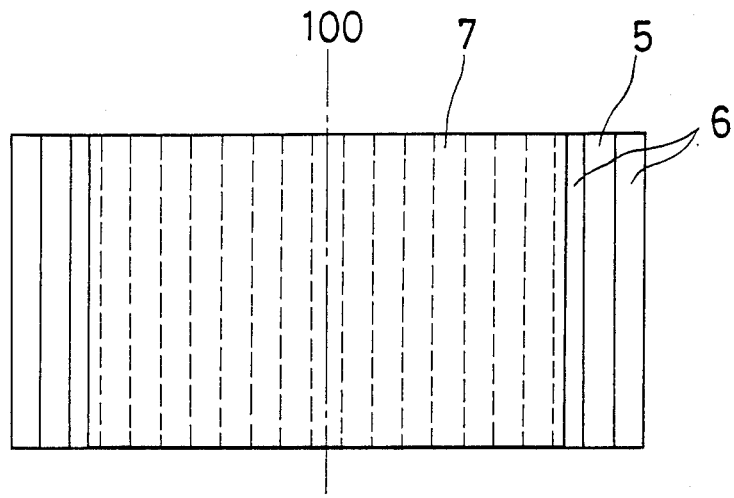
FIGS. 9(a) and 9(b), respectively, are a plane view and a sectional view showing a conventional semiconductor laser array device.
Figure 9B:
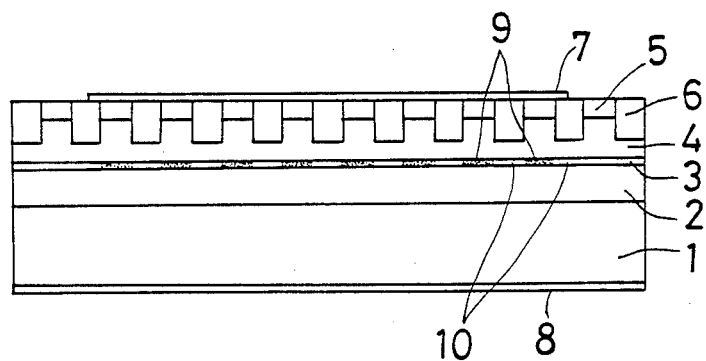
Figure 11:
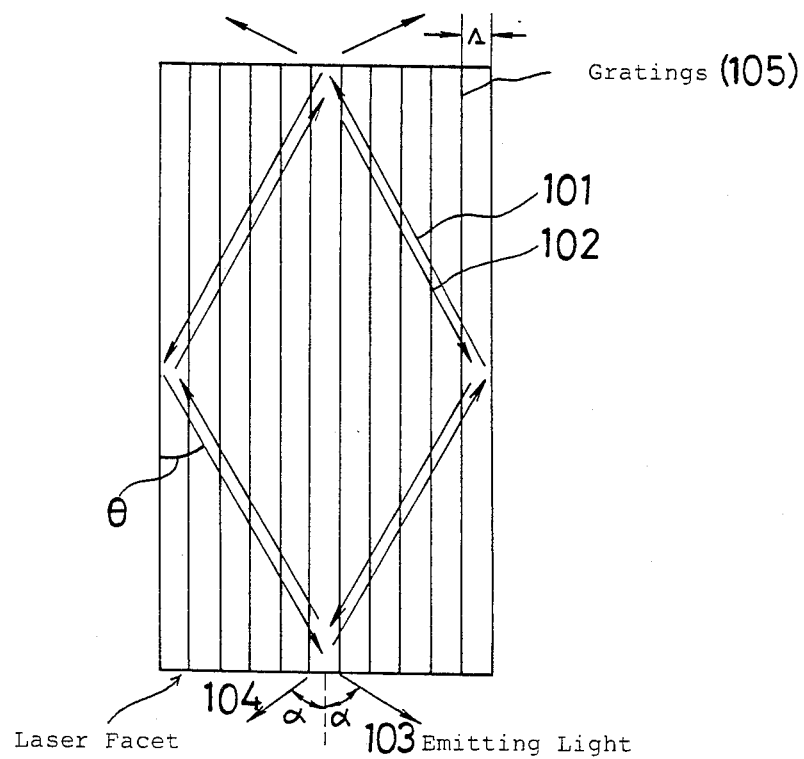
FIG. 11 is a diagram showing a laser oscillation process in the conventional semiconductor laser array device shown in FIG. 9(a).

As mentioned above, the conventional semiconductor laser array device (FIGS. 9(a) and 9(b)) is designed so that the electrical current injection portion 7 is symmetrical with respect to the line 100 along the lasing filaments 9, so that two different lightwaves 101 and 102 (FIG. 11) propagated in the reverse direction within the device attain laser oscillation with the same intensity, resulting in a far-field pattern having two peaks with the same optical intensity. This is because, due to the above-mentioned structure, the two different lightwaves have the same gain. On the contrary, the semiconductor laser array device of this invention is designed to form an electrical current injection portion, which has a significant relation with the gain, into an asymmetrical shape with respect to any line which is parallel to the direction of the waveguides of this device. Thus, one (e.g., the lightwave 101) of the two different lightwaves 101 and 102 propagated in the reverse direction within the device has a greater gain than the other (e.g., the lightwave 102), so that the lightwave 101 alone can attain laser oscillation to produce a laser light 103 while the remaining lightwave 102 cannot attain laser oscillation, resulting in a far-field pattern having a single peak. Moreover, since the device is provided with two kinds of patterned electrical current injection portions, each of which is asymmetrical with respect to any line along the waveguides, a laser light (e.g., 103) based on the desired one (e.g., 101) of the two different lightwaves 101 and 102 can be obtained by the injection of electrical current into one of the two kinds of electrical current injection portions.

EXAMPLE 1

Figure 1A:
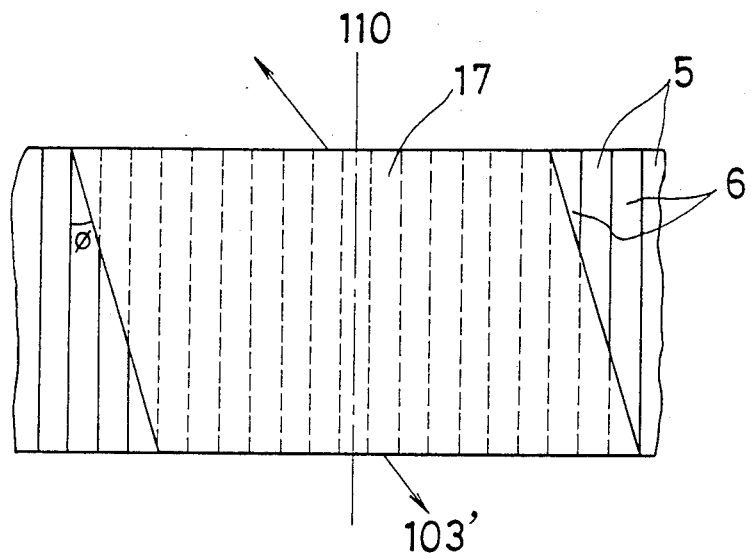
FIG. 1(a) is a plane view showing a semiconductor laser array device of this invention.
Figure 1B:
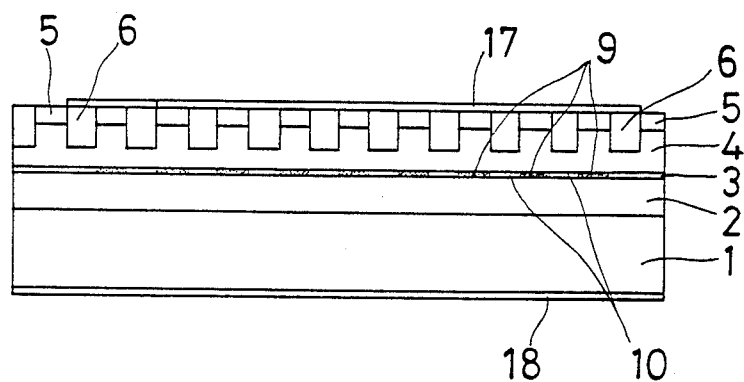
FIG. 1(b) is a sectional view showing the semiconductor laser array device shown in FIG. 1(a).

FIGS. 1(a) and 1(b), respectively, show a semiconductor laser array device of this invention, which is produced as follows: on an n-GaAs substrate 1, an n-$Al_xGa_{1-x}As$ cladding layer 2, an $Al_yGa_{1-x}As$ active layer 3, a p-$Al_xGa_{1-x}As$ cladding layer 4 and a p$^+$-GaAs cap layer 5 are successively grown by liquid phase epitaxy, molecular beam epitaxy, metal organic-chemical vapor deposition or the like. Then, a plurality of channels having a width of 2 μm and a pitch of 5 μm are formed in a parallel manner at the grown layer side by photolithography and an etching technique. On the resulting channeled substrate, an n-$Al_zGa_{1-z}As$ buried layer 6 is grown by liquid phase epitaxy, etc., to fill the channels therewith (wherein $0 \leq z < y < x$ or $0 \leq y < x < z$).

Due to the buried layer 6, the active layer 3 gives rise to lateral differences in the refraction index, so that the refraction index of each of the waveguides (i.e., lasing filaments) 9 is higher than that of the remaining portions 10. The periodic variation in the refraction index in the active layer 3 serves as a grating required for attaining laterally distributed-feedback.

Then, an electrode 18 is formed on the whole back face of the substrate of the resulting wafer, and an electrode 17 is formed as an electrical current injection portion on the upper face of the grown layers in such a manner that the electrode 17 is of an asymmetrical shape (e.g., parallelogram) with respect to any line 110 which is parallel to the waveguides 9. Finally, faces which are at right angles to the waveguides 9 are formed by a cleavage, resulting in the facets for laser resonation. The angle $\phi$ of each of the sides of the parallelogram-shaped electrode 17 to the waveguides 9 is selected to be represented by the equation (3):

$$\phi = \theta \tag{3}$$

The obtained laser light is limited to a light emitted only in the direction indicated by the arrow mark 103'. The far-field pattern of the above-mentioned semiconductor laser array device shown in FIGS. 1(a) and 1(b) is shown in FIG. 2, which indicates a single peak.

Figure 2:
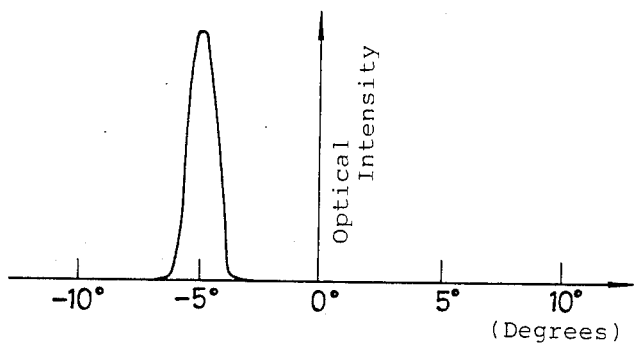
FIG. 2 is a diagram showing the far-field pattern attained by the semiconductor laser array device shown in FIG. 1(a).
Figure 5:
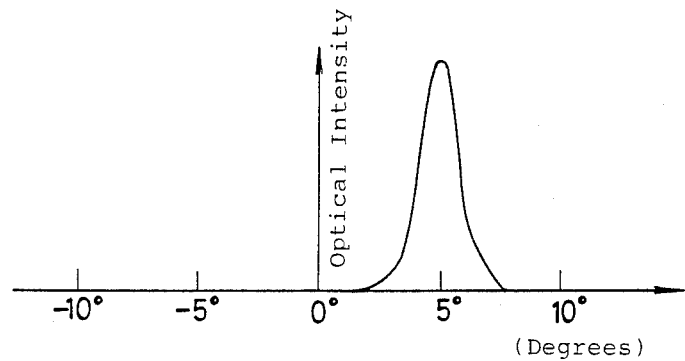
FIG. 5 is a diagram showing the far-field pattern attained by a semiconductor laser array device containing the patterned electrode shown in FIG. 4.

Alternatively, when the angle $\phi$ is selected to be $-\theta$, the obtainable laser light is limited to a light emitted in the opposite direction to the above-mentioned direction 103', attaining the far-field patern shown in FIG. 5 which has a single peak at the opposite side to the side shown in FIG. 2.

EXAMPLE 2

Figure 3:
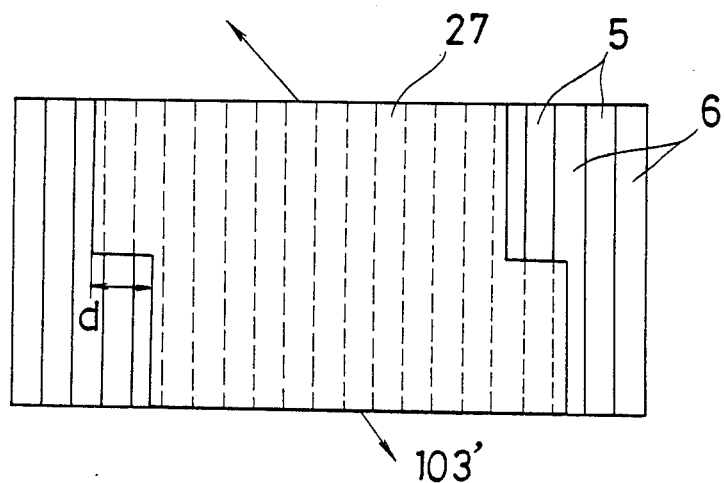
FIG. 3 is a plane view showing another semiconductor laser array device of this invention.

FIG. 3 shows another semiconductor laser device of this invention, which has the same structure as in FIGS. 1(a) and 1(b) except that a portion of each side of the electrode 27 is shaped to protrude to the outside thereof. The degree of gain of one lightwave to the other depends upon the size d of the protrusion of the electrode 27. This device comprising the flat shape of the electrode 27 also attains a far-field pattern having such a single peak as shown in FIG. 2.

Figure 4:
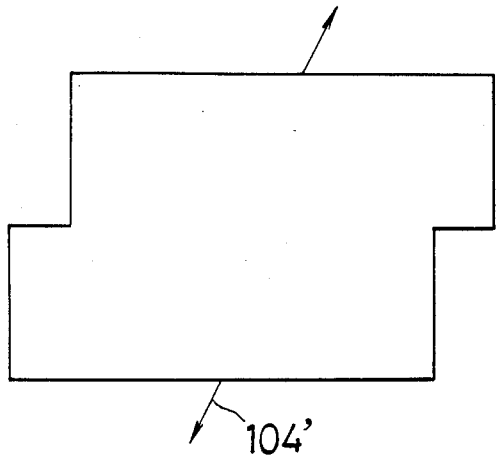
FIG. 4 is a plane view showing a pattern of the electrode for the semiconductor laser array device of this invention.

Alternatively, when the face of the electrode 27 is disposed downward on the upper face of the grown layers as shown in FIG. 4, the obtainable laser light is limited to a light emitted in the opposite direction indicated by the arrow mark 104', attaining the far-field pattern shown in FIG. 5 which has a single peak at the opposite side to the side shown in FIG. 2.

EXAMPLE 3

Figure 6A:
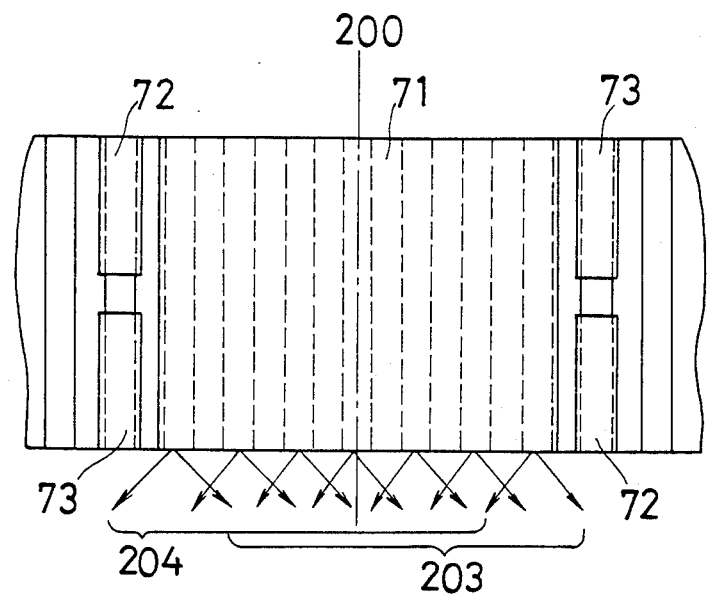
FIGS. 6(a) and 6(b), respectively, are a plane view and a sectional view showing another semiconductor laser array device of this invention.
Figure 6B:
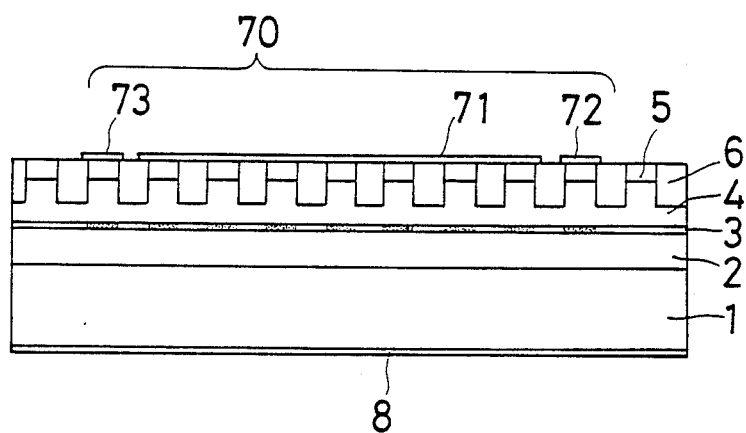

FIGS. 6(a) and 6(b) show another semiconductor laser array device of this invention, in which an n-$Al_xGa_{1-x}As$ cladding layer 2, an $Al_yGa_{1-y}As$ active layer 3, a p-$Al_xGa_{1-x}As$ cladding layer 4 and a p+-GaAs cap layer 5 are successively grown on an n-GaAs substrate 1 in the same manner as in Example 1. The back face of the substrate 1 and the upper face of the grown layers of the resulting wafer are then subjected to a vacuum evaporation treatment with metals, which can produce ohmic contacts, such as Au/Sn or the like and Au/Zn or the like, respectively, followed by a heat treatment at approximately 450° C. for 3 minutes to form alloys, resulting in an ohmic electrode 8 on the whole back face of the substrate 1 and an electrical current injection portion 70 on the upper face of the grown layers.

The electrical current injection portion 70 is composed of the body (i.e., electrode body) 71 having a symmetrical flat shape with respect to a line 200 which is parallel to the waveguides and the additional edge portions (i.e., additional electrodes) 72 positioned near both sides of the body 71, resulting in an asymmetrical flat shape as a whole with respect to the line 200. The electrical current injection edge portions (i.e., additional electrodes) 73, each of which is positioned in the opposite area at the same side of the body as the electrode 72. The electrode 70, which is composed of the electrode body 71 and the additional electrodes 73, also results in an asymmetrical flat shape as a whole with respect to the line 200. The electrodes 71, 72 and 73 can formed by photolithography and a lift-off or etching technique. Finally, faces which are at right angles to the waveguides are formed by a cleavage as facets for emitting laser light therefrom, resulting in the desired semiconductor laser array device.

Figure 7:
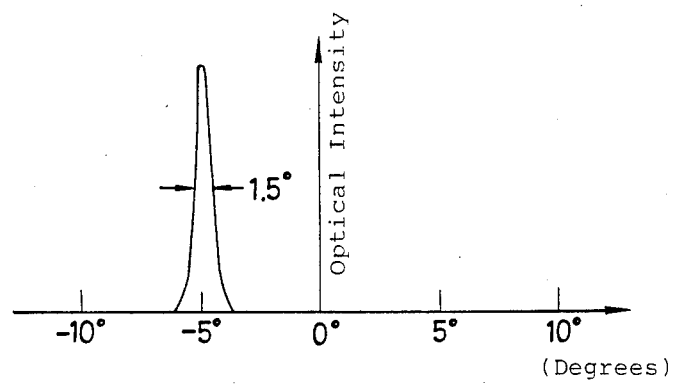
FIGS. 7 and 8, respectively, are diagrams showing the far-field patterns attained by the semiconductor laser array device shown in FIG. 6(a).
Figure 8:
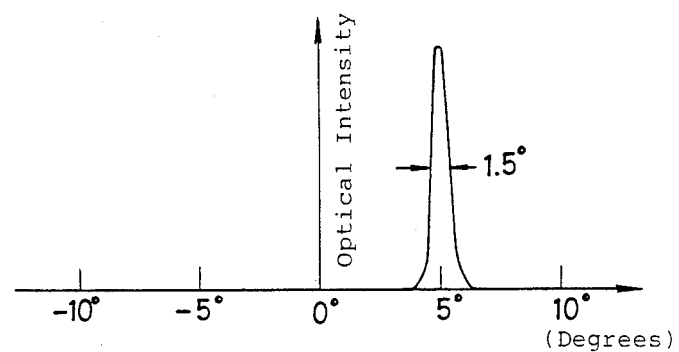
Figure 10:
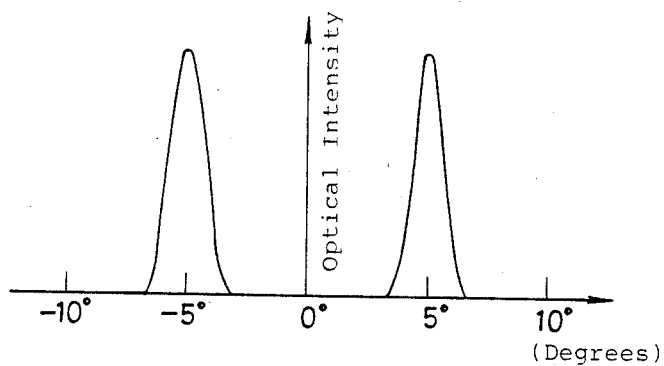
FIG. 10 is a diagram showing the far-field pattern attained by the conventional semiconductor laser array device shown in FIG. 9(a).

When electrical current is injected into the symmetrical shaped electrode body 71 alone of the resulting device, the device attains the far-field pattern shown in FIG. 10, as specified before, which has two peaks. However, when electrical current is injected into the set of the electrodes 71 and 72 (or 71 and 73), which are asymmetrical as a whole with respect to the line 200, a far-field pattern having a single peak can be attained. For instance, when the excitation of both electrodes 71 and 72 is achieved by the injection of electrical current thereinto, the lightwave 101 has a greater gain than the other lightwave 102 (FIG. 11) and attains laser oscillation while the other lightwave 102 cannot attain laser oscillation so that the emitted light propagated only in the direction indicated by the arrow marks 203 (FIG. 6(a)) can be observed. The obtained far-field pattern, which is parallel to the face of the active layer 3, exhibits a single peak having a lobe full-width of the half maximum of approximately 1.5° and an approximately $-5°$ off the normal as shown in FIG. 7. On the contrary, when both electrodes 71 and 73 are excited, the far-field pattern shown in FIG. 8 can be observed the peak of which has a lobe full-width of the half maximum of approximately 1.5° and an approximately 5° off the normal.

The above-mentioned fact indicates that the light emitted by the excitation of a set of the electrodes 71 and 73 is deflected with the declination of 10° against the light emitted by the excitation of the other set of the electrodes 71 and 73. The declination can be selected depending upon the period (or pitch) Λ of the waveguides of the device. If the device is integrated with photodetectors and/or passive waveguides, it will be able to be applied to a switching means, a modulator, etc.

When conventional semiconductor laser devices are modulated by electrical current, the oscillation wavelength obtained is liable to shift due to heat at the initial stage or the light oscillation is liable to be attained in an unstable longitudinal mode. In contrast thereto, since the deflectable device of this invention mentioned in Example 3 can attain laser oscillation under the angle control of emitted light therefrom (but it does not attain laser oscillation by the on off control of laser oscillation), it can be modulated without variation in the current injection level to a great extent so that the temperature of the device hardly varies depending upon the modulation thereof, thereby attaining a stabilized longitudinal mode oscillation.

Various modifications of the semiconductor laser array device of this invention include:

(i) Devices which are designed to provide with a structure having a different polarity from the polarity of each of the substrate and the growth layers in the above-mentioned Examples.

(ii) Devices which are designed using other materials, such as the InGaAsP/InP system, etc., which can attain laser oscillation.

(iii) Devices which are designed in such a manner that the lateral gratings therein result from the distribution of refraction index based on other concepts or methods.

(iv) Devices which are designed to have a different asymmetrically shaped electrode from that in each of Examples 1-3.

(v) Devices which are designed to define the electrical current injection portion by other concepts or methods using p-n reverse bias layers, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser array comprising:
   a substrate having a plurality of grown layers thereon including an active layer, said active layer having a plurality of parallel index-guided lasing filaments formed therein; and
   an electrical current injection portion formed on an upper face of said grown layers, said electrical current injection portion having an asymmetrical shape with respect to any line which is parallel to the lasing filaments.

2. A semiconductor laser array device according to claim 1 wherein said electrical current injection portion is an electrode formed by photolithography and a lift-off or etching technique.

3. A semiconductor laser array according to claim 1, wherein said electrical current injection portion is composed of a body having a flat shape which is symmetrical with respect to a line along the lasing filaments, and first and second additional edge portions are positioned at both sides of said body, said first additional edge portion being positioned on a left upper half of said body and on a right lower half of said body, said second additional edge portion being positioned opposite to said first additional edge portion resulting in an asymmetrically flat shape as a whole with respect to any line along the lasing filaments.

4. A semiconductor laser array device according to claim 3, wherein said additional edge portions are electrically connected to said body.

5. A semiconductor laser array device according to claim 3, wherein said additional edge portions are electrically separated from said body.

6. A semiconductor laser array device according to claim 4 or 5, wherein said additional edge portions are composed of a pair of edge portions positioned at both sides of said body, respectively, in an asymmetrical manner with respect to any line along the lasing filaments.

7. A semiconductor laser array device according to claim 5, wherein said additional edge portions are composed of two pairs of edge portions each pair of which are positioned at either side of said body, respectively, in an asymmetrical manner with respect to any line along the lasing filaments, resulting in one set consisting of said body and one pair of edge portions and another set consisting of said body and the other pair of edge portions to be excited by the injection of electrical current thereinto.

* * * * *